United States Patent
Lee et al.

(10) Patent No.: US 8,319,348 B2
(45) Date of Patent: Nov. 27, 2012

(54) METAL INTERCONNECT OF SEMICONDUCTOR DEVICE

(75) Inventors: Jongmyeong Lee, Seongnam-si (KR); Zungsun Choi, Seoul (KR); Gilheyun Choi, Seoul (KR); Byung-Lyul Park, Seoul (KR); Jinho Park, Yongin-si (KR); Hye Kyung Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 306 days.

(21) Appl. No.: 12/722,643

(22) Filed: Mar. 12, 2010

(65) Prior Publication Data

US 2010/0230824 A1 Sep. 16, 2010

(30) Foreign Application Priority Data

Mar. 12, 2009 (KR) .................. 10-2009-0021320

(51) Int. Cl.
   *H01L 23/48* (2006.01)
(52) U.S. Cl. ............. 257/774; 257/773; 257/E23.011
(58) Field of Classification Search .............. 257/774, 257/E23.011, 773
   See application file for complete search history.

(56) References Cited

U.S. PATENT DOCUMENTS

| 5,614,764 | A | * | 3/1997 | Baerg et al. | ............ 257/767 |
| 6,579,795 | B1 | | 6/2003 | Hau-Riege | |
| 6,717,268 | B2 | * | 4/2004 | Hau-Riege | ............ 257/758 |
| 7,087,516 | B2 | * | 8/2006 | Hau-Riege | ............ 438/622 |
| 7,288,462 | B2 | | 10/2007 | Wu et al. | |

FOREIGN PATENT DOCUMENTS

JP  2003-347300  12/2003
KR  10-0664870   12/2006

* cited by examiner

*Primary Examiner* — Roy Potter
(74) *Attorney, Agent, or Firm* — Myers Bigel Sibley & Sajovec, P.A.

(57) ABSTRACT

Provided are a metal interconnect of a semiconductor device and a method of fabricating the metal interconnect. The metal interconnect includes a metal line having a first end and a second end disposed on an opposite side to the first end, a via electrically connected to the metal line, and a non-active segment extending from the first end and including a void. Tensile stress is decreased to prevent a void from occurring under the via. Accordingly, line breakage due to electromigration is substantially prevented, thus improving electrical characteristics of the device.

18 Claims, 12 Drawing Sheets

Fig. 1
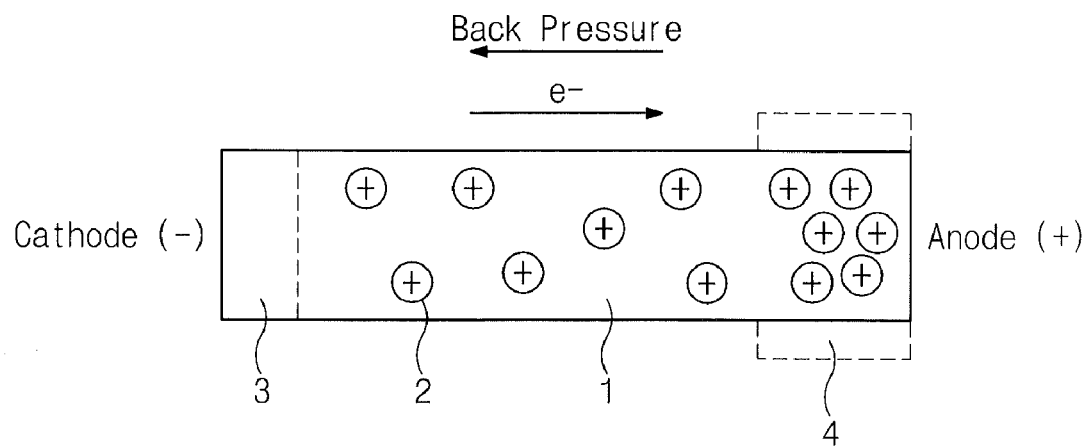
Fig. 2A              Fig. 2B
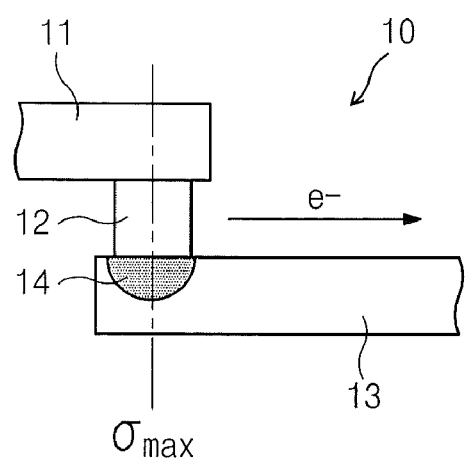     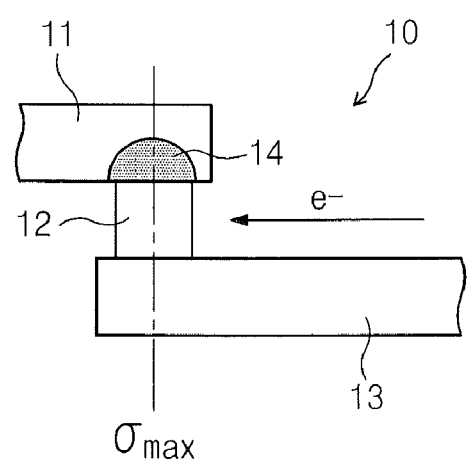

METAL INTERCONNECT OF SEMICONDUCTOR DEVICE

REFERENCE TO PRIORITY APPLICATION

This application claims priority to Korean Patent Application No. 10-2009-0021320, filed Mar. 12, 2009, the contents of which are hereby incorporated herein by reference.

FIELD OF THE INVENTION

The present invention relates to metal interconnects of semiconductor devices, and, more particularly, to metal interconnects having improved reliability against electromigration, and methods of fabricating metal interconnects.

BACKGROUND

To fabricate a large scale integrated circuit (LSI) semiconductor device, it is increasingly important to form a metal interconnect resistant to high current density that is caused by scaling of a semiconductor device. That is, as semiconductor devices are increasingly miniaturized, and much more transistors are integrated on a unit area, the sizes of metal lines connected to transistors are decreased, so that the density of currents flowing through the metal lines is increased.

As the density of currents is increased, breakage possibilities of metal interconnects may be increased. Particularly, breakage of metal interconnects may be caused by electromigration (EM). Thus, a metal interconnect having an improved structure resistant to breakage due to electromigration, and a method of fabricating the metal interconnect are required.

SUMMARY

The present disclosure provides a metal interconnect having improved reliability against electromigration, and a method of fabricating the metal interconnect.

Embodiments of the inventive concept provide metal interconnects of a semiconductor device, the metal interconnects include: a metal line having a first end and a second end disposed on an opposite side to the first end; a via electrically connected to the metal line; and a non-active segment extending from the first end and including a void.

In some embodiments, a current may be introduced to the metal line through the via, the current may flow from the second end to the first end, and the current may flow without the non-active segment.

In other embodiments, the non-active segment may have a sharp shape that decreases in width in a direction extending from the first end.

In still other embodiments, the non-active segment may have a minimum length that is the same as a saturation length of the void.

In even other embodiments, the void may be disposed in an end of the non-active segment.

In yet other embodiments, the second end may include a rounded segment.

In further embodiments, the metal line may include an active segment providing a path of a current between the first and second ends, and the non-active segment may extend from the active segment at the first end.

In even further embodiments, the void may have a saturation length that is proportional to at least one of a length of the active segment and a density of the current flowing through the active segment.

In other embodiments of the inventive concept, metal interconnects of a semiconductor device include: an active segment having a cathode end and an anode end and providing a path of a current between the cathode end and the anode end; a non-active segment extending from the cathode end and disposed without the path of the current and including a void; and a via electrically connected to the cathode end.

In some embodiments, the non-active segment may have a sharp shape that decreases in width from the cathode end to an end of the non-active segment, and the anode end of the active segment may be rounded.

In other embodiments, the non-active segment may have a length that is equal to or greater than a saturation length of the void.

In still other embodiments, an electron may be introduced to the cathode end through the via, and the electron may flow from the cathode end to the anode end.

In even other embodiments, a tensile stress may evolve in a region of the cathode end under the via, and the tensile stress may be decreased toward the non-active segment and released by the void.

In yet other embodiments, a compressive stress may evolve in the anode end, and generate a back pressure offsetting a flow of the electron.

In still other embodiments of the inventive concept, metal interconnects of a semiconductor device include: a metal line having a cathode end and an anode end; and a via electrically connected to the metal line, wherein the cathode end includes a sharp extension segment, the sharp extension segment includes a void releasing a tensile stress that is generated in the cathode end by a flow of electrons introduced to the metal line via the via, and the anode end has a rounded shape.

In some embodiments, the extension segment may be disposed without the flow of the electrons, and have a length that is equal to or greater than a saturation length of the void.

In other embodiments, the via may be in contact with the cathode end, and spaced apart from the extension segment.

In even other embodiments of the inventive concept, methods of fabricating a metal interconnect of a semiconductor device include: preparing a dielectric; disposing a mask on the dielectric, the mask including a cascade opening in a first end and a tetragonal opening in a second end, the cascade opening gradually decreasing in width, the tetragonal opening having a constant width; partially removing the dielectric through a photo process using the mask to form a trench that has a first edge with a sharp shape patterned through the cascade opening, and a rounded second edge patterned through the tetragonal opening, the sharp edge gradually decreasing in width; and filling the trench with metal to form a metal line, the metal line including a void.

In some embodiments, in the forming of the metal line, the first edge may have a relatively small opening area that is incompletely filled with the metal, so that the void is formed in the first edge.

In other embodiments, the forming of the metal line may include forming a metal layer in the trench through one of chemical vapor deposition, physical vapor deposition, and electroplating.

BRIEF DESCRIPTION OF THE DRAWINGS

FIG. 1 is a cross-sectional view illustrating electromigration (EM) related with an embodiment of the inventive concept;

FIGS. 2A and 2B are cross-sectional views illustrating a metal interconnect in which a void is generated by electromigration related with an embodiment of the inventive concept;

DETAILED DESCRIPTION OF THE EMBODIMENTS

Figure 3A:
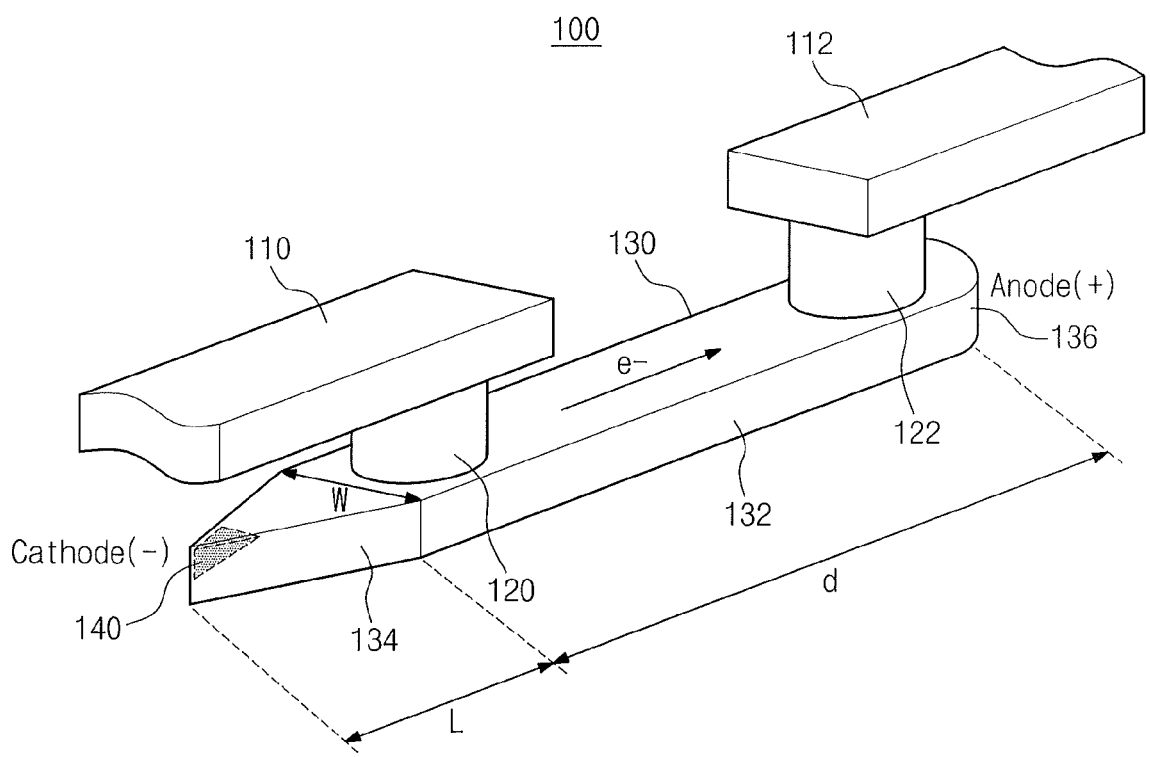
FIGS. 3A and 3B are perspective views illustrating a metal interconnect of a semiconductor device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

Embodiment

FIG. 1 is a cross-sectional view illustrating electromigration (EM) related with an embodiment of the inventive concept.

Referring to FIG. 1, when current flows to a conductor 1, electrons e⁻ migrate in a direction opposite to a flow direction of the current. For example, electrons flow from an end (cathode) of the conductor 1 to the other end (anode). When a large amount of current causes a large amount of the electrons e⁻ to migrate, electromigration may occur in which the electrons e⁻ collide with metal atoms 2 surrounding the electrons, so that the metal atoms 2 migrate in the direction in which the electrons e⁻ flow. That is, the driving force of electromigration may be an electron wind. As current density is increased, the occurrence possibility of electromigration is increased.

Electromigration causes flux divergence of the metal atoms 2. When a flux going in a cross section of the conductor 1 is greater than a flux going out the cross section of the conductor 1, the metal atoms 2 are depleted. On the contrary, when a flux going in a cross section of the conductor 1 is less than a flux going out the cross section of the conductor 1, the metal atoms 2 are accumulated. For example, the metal atoms 2 may be depleted in the upper stream (cathode) of an electron wind, and the metal atoms 2 may be accumulated in the down stream (anode) of the electron wind. Tensile stress may evolve along the longitudinal direction of the conductor 1 in a region where the metal atoms 2 are depleted, and compressive stress may evolve along the longitudinal direction of the conductor 1 in a region where the metal atoms 2 are accumulated. Accordingly, a stress gradient may occur along the longitudinal direction of the conductor 1.

When tensile stress is sufficiently increased, a void 3 is generated in the cathode where the metal atoms 2 are depleted. The void 3 increases the resistance of the conductor 1. When the tensile stress is further increased, the void 3 is further increased. When the size of the void 3 reaches the width of the conductor 1, the conductor 1 may be open. In a similar manner, when the compressive stress is sufficiently increased, a protrusion 4 is generated in the anode where the metal atoms 2 are accumulated. The conductor 1 may be shorted to an adjacent conductor through the protrusion 4.

When the metal atoms 2 are further accumulated, the compressive stress applies a back pressure from the anode to the cathode. When the back pressure is sufficiently increased, the back pressure offsets the driving force (electron wind) of electromigration. When the electron wind and the back pressure are in equilibrium, the metal atoms 2 do not migrate to the anode anymore. Thus, the growth of the void 3 is stopped, the conductor 1 reaches the so-called steady state and has a constant resistance value.

As described above, electromigration is diffusion of metal atoms generated by an electron wind. The metal atoms 2 may be depleted or accumulated in a region where flux divergence occurs. The void 3 or the protrusion 4 is generated in a region where the metal atoms 2 are depleted or accumulated so as to short or open the conductor 1, which is called electromigration-induced failure.

FIGS. 2A and 2B are cross-sectional views illustrating a metal interconnect in which a void is generated by electromigration.

Referring to FIGS. 2A and 2B, the metal interconnect 10 may generally include an upper interconnect 11 and a lower interconnect 13 that are electrically connected through a via 12. A void due to electromigration tends to occur at a boundary of different materials. For example, when electrons flow from the upper interconnect 11 to the lower interconnect 13 as illustrated in FIG. 2A, the occurrence possibility of a void 14 may be high in the lower interconnect 13 under the via 12. In a similar manner, when electrons flow from the lower interconnect 13 to the upper interconnect 11 as illustrated in FIG. 2B, the occurrence possibility of the void 14 may be high in the upper interconnect 11 over the via 12.

A current flow, as illustrated in FIGS. 2A and 2B, may generate a stress gradient along the lower interconnect 13 and/or the upper interconnect 11. The occurrence possibility of the void 14 is high at the position of the via 12 where a maximum tensile stress $\sigma_{max}$ is applied. As the maximum tensile stress $\sigma_{max}$ is increased, the occurrence possibility of the void 14 is increased. Thus, to decrease the maximum tensile stress $\sigma_{max}$ at the position adjacent to the via 12 in the upper interconnect 11 and the lower interconnect 13 may be to prevent or minimize breakage of the metal interconnect 10 due to electromigration.

Figure 3B:
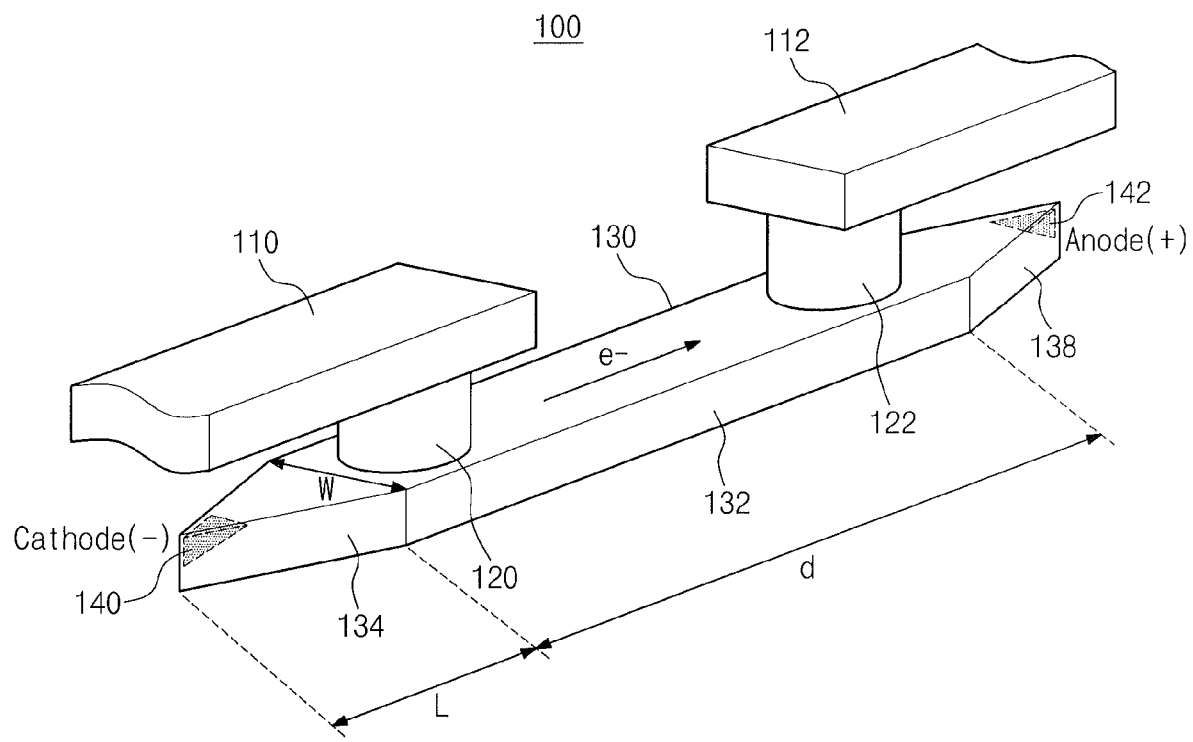

FIGS. 3A and 3B are perspective views illustrating a metal interconnect of a semiconductor device according to an embodiment of the inventive concept.

Referring to FIG. 3A, a metal interconnect 100 may include a metal line 130 transmitting electrical signals. The metal line 130 may be formed of one of aluminum (Al), copper (Cu), and a combination thereof. When a current flows along the metal line 130, electrons e⁻ flow in the opposite direction to a flow direction of the current, that is, in the direction from a cathode to an anode.

A cathode end of the metal line 130 may be electrically connected to a first metal line 110 through a first via 120. An anode end of the metal line 130 may be electrically connected to a second metal line 112 through a second via 122. The first and second metal lines 110 and 112 may be formed of one of aluminum (Al), copper (Cu), and a combination thereof. The first and second vias 120 and 122 may be formed of tungsten (W). Alternatively, the first and second vias 120 and 122 may be formed of the same metal or alloy as that of the first and second metal lines 110 and 112.

For convenience in description, the metal line 130, the first metal line 110, the first via 120, the second metal line 112, and the second via 122 are referred to as a lower line, a cathode line, a cathode via, an anode line, and an anode via, respectively.

The lower line 130 may include an active segment 132 where current flows, and a non-active segment 134 without a current flow. The non-active segment 134 may extend from the cathode end of the active segment 132. The non-active segment 134 and the active segment 132 may have the same material, but may have different shapes. For example, the non-active segment 134 may have a sharp shape, a width of which is less than the width of the active segment 132 and gradually decreased. For example, a length L of the non-active segment 134 may be greater than a width W thereof. As another example, the non-active segment 134 may have a stair or cascade shape, a width of which is less than the width of the active segment 132 and gradually decreased. The non-active segment 134 may include a void 140 that is intentionally formed therein. The void 140 may be disposed in an end of the non-active segment 134. The anode end of the active segment 132 may include a rounded segment 136. In some embodiment of the present invention, as shown in FIG. 3B, the anode end of the active segment 132 may be structured identical or analogous to the non-active segment 134. For example, the anode end of the active segment 132 may include a second non-active segment 138. The second non-active segment 138 may have a sharp or cascade shape including a second void 142 that is intentionally formed therein. Explanations of the non-active segment 132 and the void 140 hereinafter may be applied to the second non-active segment 138 and the second void 142.

A voiding process of intentionally forming the void 140 in the non-active segment 134 may be as follows.

Figure 4A:
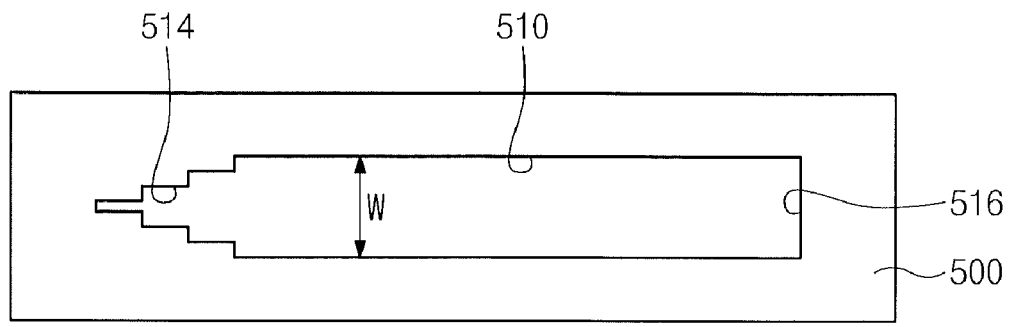
FIGS. 4A through 4C are cross-sectional views illustrating a voiding process according to an embodiment of the inventive concept.
Figure 4B:
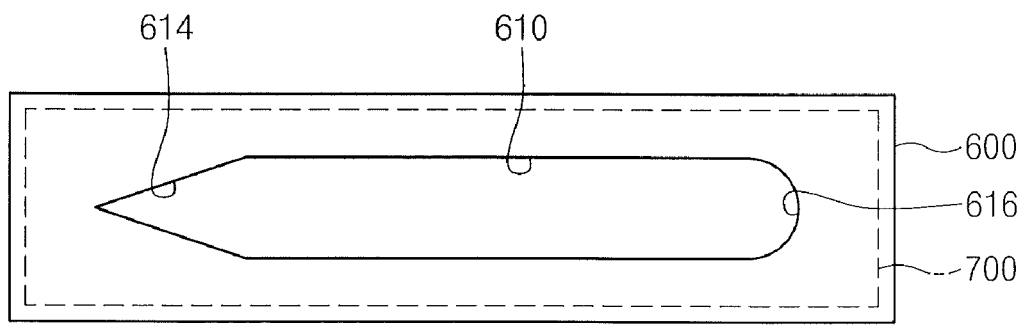
Figure 4C:
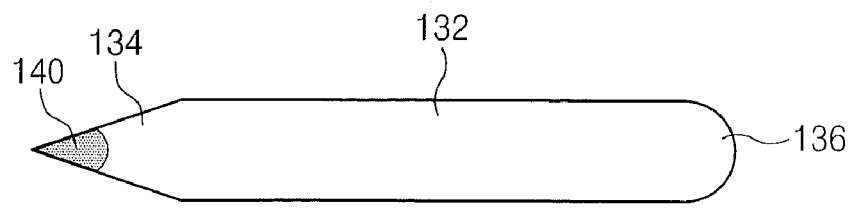

FIGS. 4A through 4C are cross-sectional views illustrating a voiding process according to an embodiment of the inventive concept. FIGS. 5A through 5D are perspective views illustrating the voiding process.

Figure 5A:
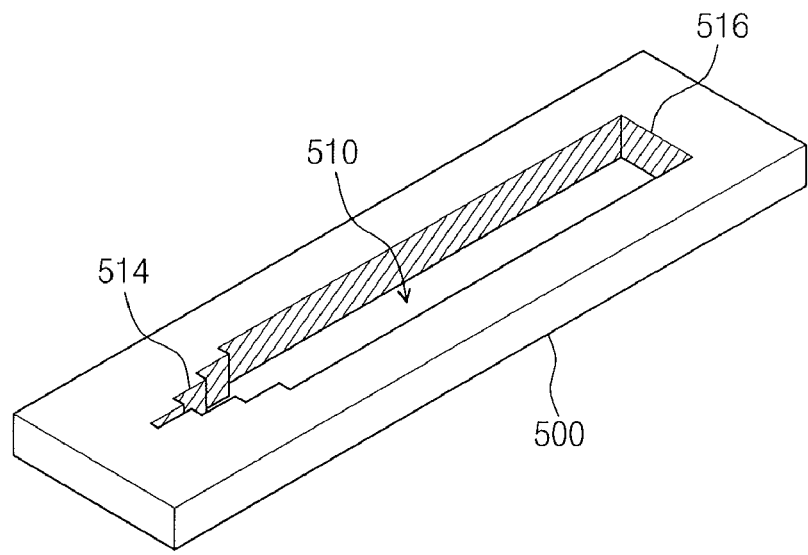
FIGS. 5A through 5D are perspective views illustrating the voiding process of FIGS. 4A through 4C.

Referring to FIGS. 4A and 5A, a mask 500 may be prepared, which has an opening 510 required for forming the lower line 130. The opening 510 may include a first opening 514 for forming the non-active segment 134 having the sharp shape extending from the cathode end of the lower line 130, and a second opening 516 for forming the rounded segment 136. For example, the first opening 514 may have a stair or cascade shape in which a width W is gradually decreased, and the second opening 516 may have a tetragonal shape, in which the width W is approximately constant. Alternatively, the first opening 514 may have a straight line shape in which a width W is gradually decreased. As another embodiment, the mask 500 may be inversely formed to have a solid pattern 510 required for forming the lower line 130. The solid pattern 510 may include a first portion 514 for forming the non-active segment 134 having the sharp or cascade shape end extending from the cathode end of the lower line 130, and a second portion 516 for forming the rounded segment 136. For example, the first portion 514 may have a stair or cascade shape in which a width W is gradually decreased, and the second portion 516 may have a tetragonal shape. A damascene pattern may be formed through a photo process using the mask 500.

Figure 5B:
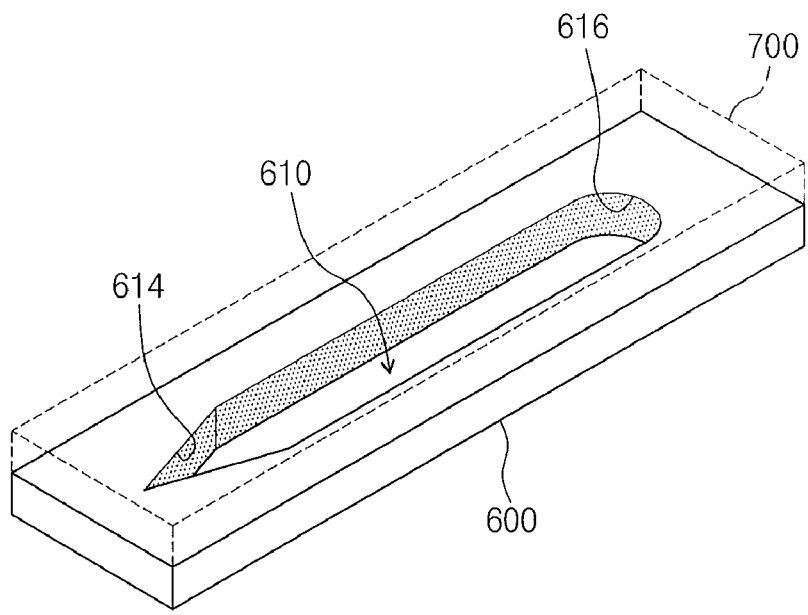

Referring to FIGS. 4B and 5B, a trench 610 may be formed by patterning a dielectric 600 through an etching process and a photo process using the mask 500. For example, the trench 610 may be formed by applying photoresist on the dielectric 600, performing a developing process using the mask 500 to form a photoresist pattern, and then partially removing the dielectric 600 through an etching process using the photoresist pattern as an etching mask. For example, the trench 610 may have a sharp edge 614 by light diffused through the cascade-shaped first opening 514 of the mask 500 in a photo process, and have a rounded edge 616 by light diffused through the tetragonal shaped second opening 516. Differently, the trench 610 may have a stair or cascade edge 614 by light diffused through the first opening 514 and a rounded edge 616 by light diffused through the second opening 516.

The trench 610 may be filled with a metal layer 700 that may be formed through a metal depositing process such as physical vapor deposition (PVD), chemical vapor deposition (CVD), and electroplating (EP). When the metal layer 700 is formed, the sharp edge 614 having a relatively small open area may not be completely filled with metal atoms. A narrow opening of the sharp edge 614 increases the occurrence possibility of an overhang when the metal layer 700 is formed. Thus, the sharp edge 614 may not be completely filled with metal atoms. Unlike this, since the rounded edge 616 has a larger open area than that of the sharp edge 614, the rounded edge 616 may be completely filled with metal atoms. The metal layer 700 formed on the dielectric 600 may be selectively removed, e.g., through chemical mechanical polishing (CMP). These explanations may be applied to the trench 610 having a stair or cascade edge 614 and a rounded edge 616.

Figure 5C:
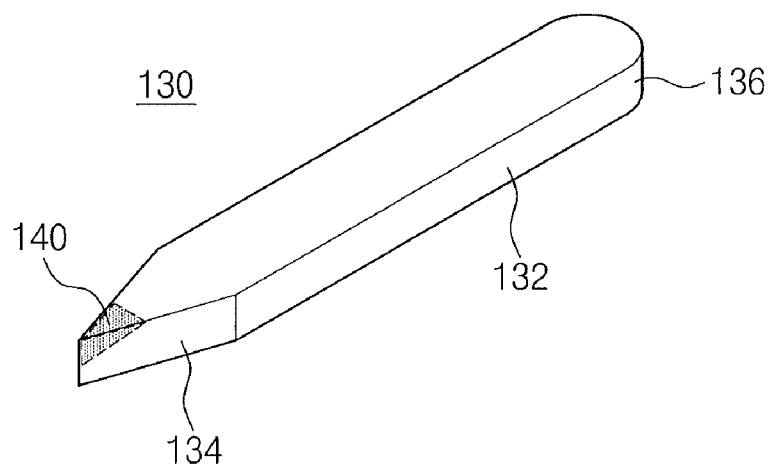
Figure 5D:
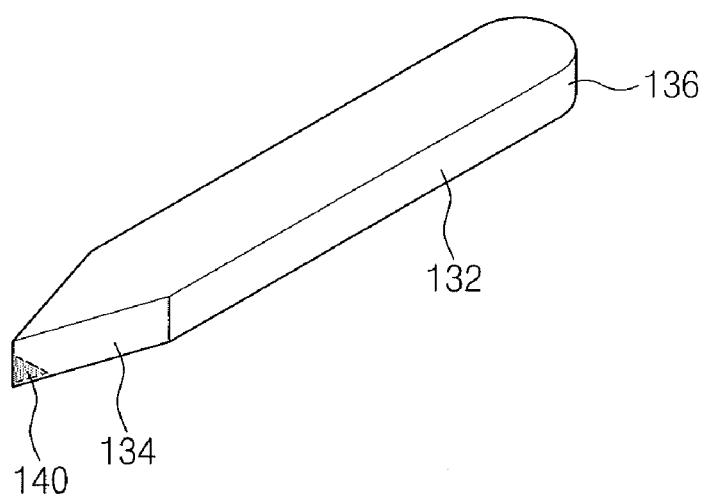

Referring to FIGS. 4C, 5C and 5D, the dielectric 600 is removed to form the non-active segment 134 having the sharp or cascade shape extending from the cathode end of the active segment 132, and the lower line 130 including the rounded segment 136 in the anode end of the active segment 132. Even when an alternating current (AC) flows through the lower line 130, a net current flows in a direction. Thus, the cathode and the anode may be determined in the lower line 130 regardless of whether a current flowing through the lower line 130 is a direct current or an alternating current. In addition, the non-active segment 134 may be formed in the cathode end, and the rounded segment 136 may be formed in the anode end.

Since the sharp or cascade edge 614 is not completely filled with metal atoms as described above, the void 140 may be formed in the non-active segment 134. Since the rounded edge 616 is completely filled with metal atoms, the void 140 may not be formed in the rounded segment 136. The void 140 may be formed approximately in the end of the non-active segment 134. Particularly, the void 140 may be formed in the upper portion of the end of the non-active segment 134 as illustrated in FIG. 5C. Alternatively, the void 140 may be formed in the lower portion of the end of the non-active segment 134 as illustrated in FIG. 5D. Alternatively, the void 140 may be formed in a vertical edge portion of the end of the non-active segment 134.

Referring again to FIG. 3A, the length L of the non-active segment 134 may be equal to or greater than a saturation length l of the void 140. The saturation length l of the void 140 may be determined by Equation (1) and Equation (2). The length L of the non-segment 134 may vary with a length d of the active segment 132 and a current density j. Equation (1) and Equation (2) may be used to determine the length of the non-active segment 134.

$$l = d - \frac{2}{k}\left[\sqrt{kd+1} - 1\right] \qquad (1)$$

$$k = \frac{z^* \rho j e}{\Omega B} \qquad (2)$$

where $z^*$ denotes an effective charge number, $\rho$ denotes resistivity, j denotes a current density, e denotes a fundamental electron charge, B denotes effective modulus, and $\Omega$ denotes an atomic volume.

According to Equation (1) and Equation (2), the saturation length l of the void 140, that is, the minimum length L of the non-active segment 134 may be determined from the current density j and the length d of the active segment 132. The minimum length L (=l) of the non-active segment 134 is proportional to the current density j. Thus, when the length L of the non-active segment 134 is increased, the current density j is increased, that is, a current amount is increased. When the length L of the non-active segment 134 is equal to or greater than the saturation length l of the void 140, breakage of the lower line 130 due to electromigration may be substantially prevented, which will be described with reference to FIG. 6C.

Figure 6A:
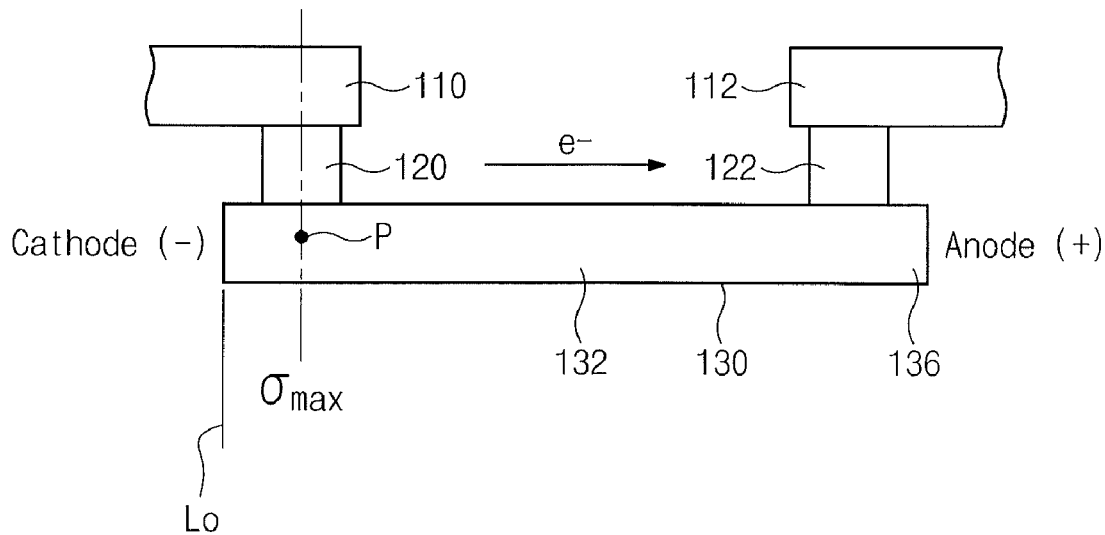
FIGS. 6A through 6C are cross-sectional views illustrating characteristics according to whether a metal interconnect of a semiconductor device includes a non-active segment and a deliberated void, according to an embodiment of the inventive concept.
Figure 6B:
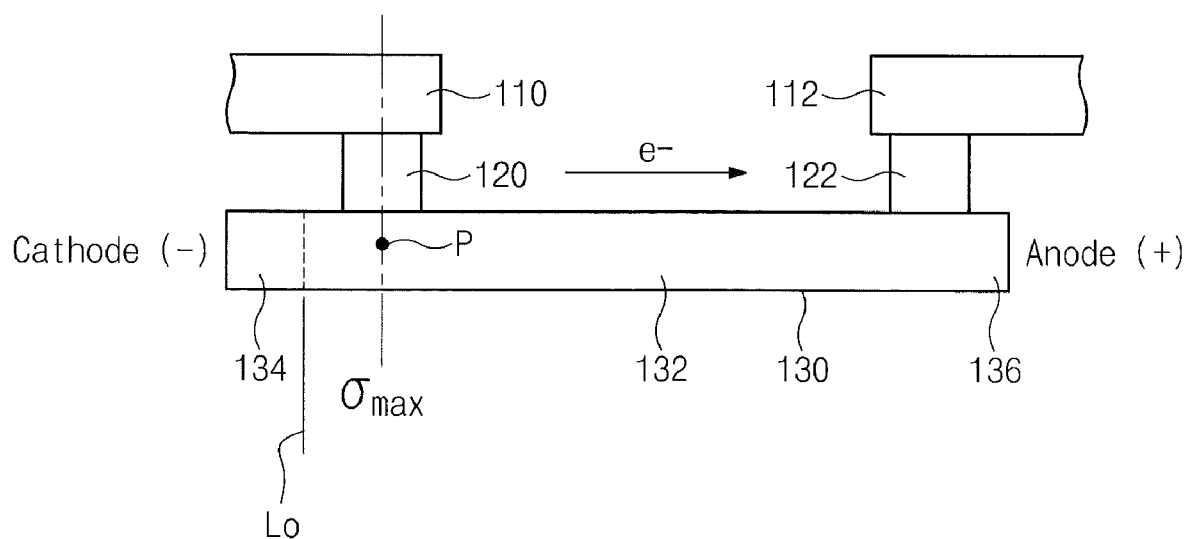
Figure 6C:
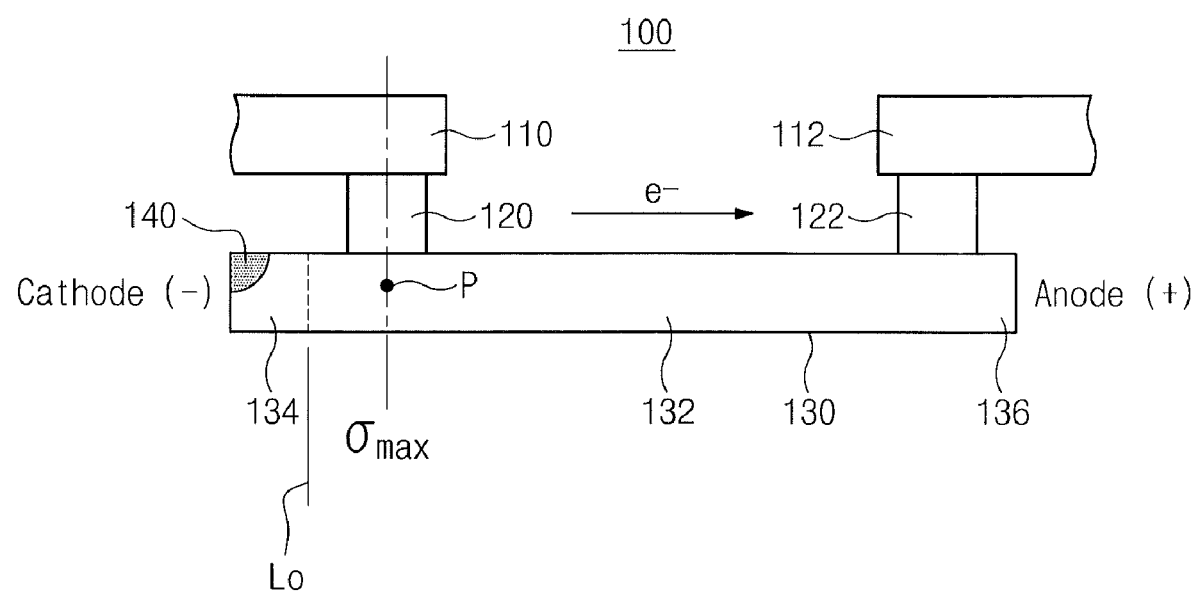
Figure 7A:
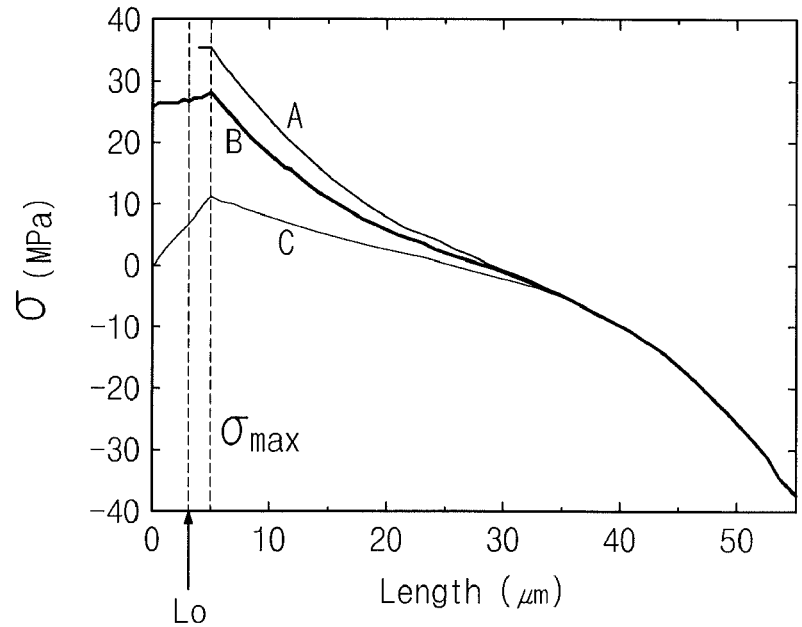
FIGS. 7A and 7B are graphs illustrating stress profiles during an electromigration test.
Figure 7B:
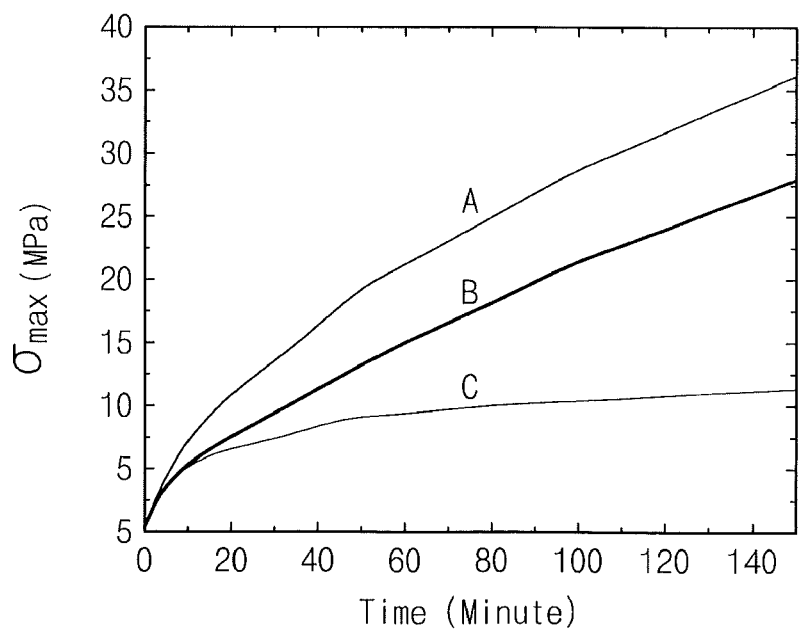

FIGS. 6A through 6C are cross-sectional views illustrating characteristics according to whether a metal interconnect of a semiconductor device includes a non-active segment and an intentional void or not, according to an embodiment of the inventive concept. FIGS. 7A and 7B are graphs illustrating stress profiles during an electromigration test. In FIG. 7A, when a stress σ is positive, it denotes a tensile stress, and when the stress σ is negative, it denotes a compressive stress.

Referring to FIG. 6A, the lower line 130 includes the active segment 132, but the non-active segment 134 is not included. The active segment 132 may include the rounded segment 136 in the anode end. The other parts thereof may be similar to those of the previous embodiments. When electrons flow from a cathode to an anode through the lower line 130, the maximum tensile stress $\sigma_{max}$ may be applied to a point P disposed vertically under the first via 120. Referring to FIGS. 6A and 7A, since a case A where the non-active segment 134 and the intentional void 140 are not included is greater in the tensile stress σ than cases B and C where the non-active segment 134 and the intentional void 140 are provided, a void occurs in the case A and the size of the void may be increased. The tensile stress σ in a cathode end $L_0$ of the active segment 132 is approximately the same as the maximum tensile stress $\sigma_{max}$. Referring to FIG. 7B, the maximum tensile stress $\sigma_{max}$ is gradually increased at the point P over time, which may mean that the occurrence possibility of a void is very high at the point P.

Referring to FIG. 6B, the case B is provided in which the lower line 130 includes the non-active segment 134 at the cathode, but the intentional void 140 is not included in the non-active segment 134. Referring to FIGS. 6B and 7A, since the non-active segment 134 is provided in the case B, the case B is slightly less in the tensile stress σ than the case A of FIG. 6A, which may mean that the occurrence possibility of a void is decreased. However, referring to FIG. 7B, the maximum tensile stress $\sigma_{max}$ of the case B is gradually increased at the point P over time, which may mean that the occurrence possibility of a void is very high at the point P. Thus, the case B in which the intentional void 140 is not included in the non-active segment 134 may have substantially the same characteristic as the case A. Even in the case B, the tensile stress σ is approximately the same as the maximum tensile stress $\sigma_{max}$ at the cathode end $L_0$ of the active segment 132.

FIG. 6C is the case C according to the current embodiment, in which the lower line 130 includes the non-active segment 134 at the cathode, and the void 140 is intentionally formed in the non-active segment 134. Referring to FIGS. 6C and 7A, the tensile stress σ in the case C of FIG. 6C is greatly decreased toward the non-active segment 134 at the cathode end $L_0$ of the active segment 132, compared with the case A of FIG. 6A and the case B of FIG. 6B. Thus, the tensile stress σ is approximately close to zero at the end of the non-active segment 134, that is, the portion where the void 140 is disposed. This may mean that a void does almost not occur at the point P in the case C, compared with the cases A and B. It is considered that this great decrease in the tensile stress σ is because the void 140 releases the tensile stress σ. Referring to FIG. 7B, the maximum tensile stress $\sigma_{max}$ of the case C is just slightly increased at the point P, and thus approximately constant over time. Accordingly, it may be considered that a void does almost not occur at the point P. Based on the above consideration with reference to FIGS. 7A and 7B, the case C according to the current embodiment may be resistant to breakage due to electromigration when the length of the non-active segment 134 is equal to or greater than the saturation length of the void 140.

Figure 8:
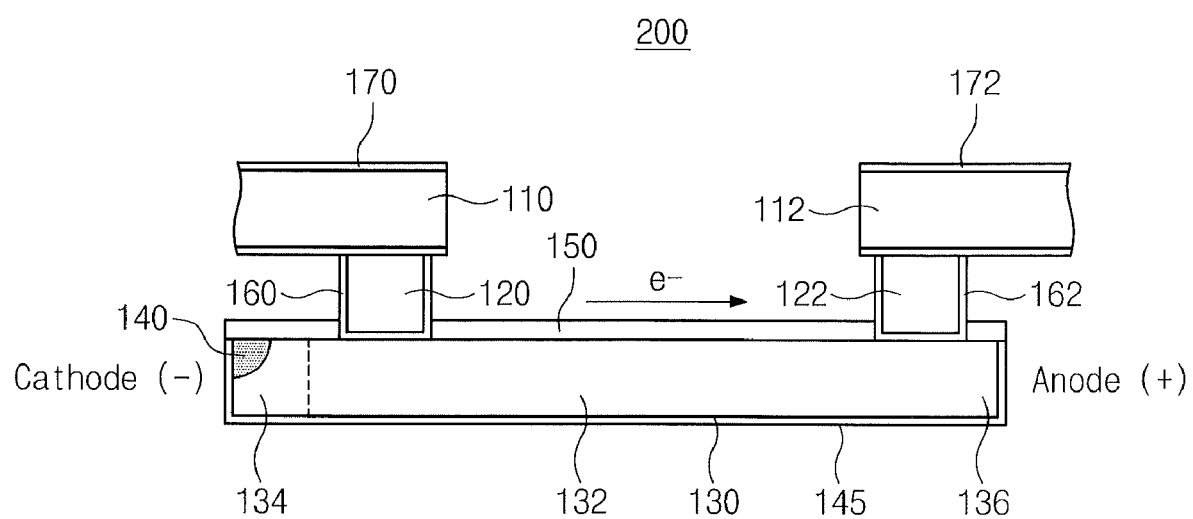
FIG. 8 is a cross-sectional view illustrating a metal interconnect of a semiconductor device according to an embodiment of the inventive concept.

FIG. 8 is a cross-sectional view illustrating a metal interconnect 200 of a semiconductor device according to an embodiment.

Referring to FIG. 8, the metal interconnect 200 may include a barrier layer 145 surrounding the lower and side surfaces of the lower line 130. When the lower line 130 is formed of one of copper (Cu) and alloy including copper (Cu), such as CuSn, CuTi, CuZr, CuSi, and CuAl, the barrier layer 145 may prevent diffusion of copper (Cu). The barrier layer 145 may be formed by depositing one of Ti, TiN, Ta, TaN and combinations thereof.

The metal interconnect 200 may further include a dielectric 150 that covers portions of the upper surface of the lower line 130, which are not in contact with the first via 120 and the second via 122. The dielectric 150 may be formed by depositing one of SiN, $Si_3N_4$, SiON, $SiO_2$ and combinations thereof. A barrier layer 160 may be disposed on at least one of the side surface of the first via 120 and the lower surface of the first via 120 contacting the lower line 130. A barrier layer 162 may be disposed on at least one of the side surface of the second via 122 and the lower surface of the second via 122. The material of the barrier layers 160 and 162 may be similar to or the same as that of the barrier layer 145.

A barrier layer 170 may be disposed on the upper and lower surfaces of the cathode line 110, and a barrier layer 172 may be disposed on the upper and lower surfaces of the anode line 112. The material of the barrier layers 170 and 172 may be similar to or the same as that of the barrier layer 145. Since the other parts of the current embodiment are the same as those of FIG. 3A, a description thereof will be omitted.

Application

Figure 9A:
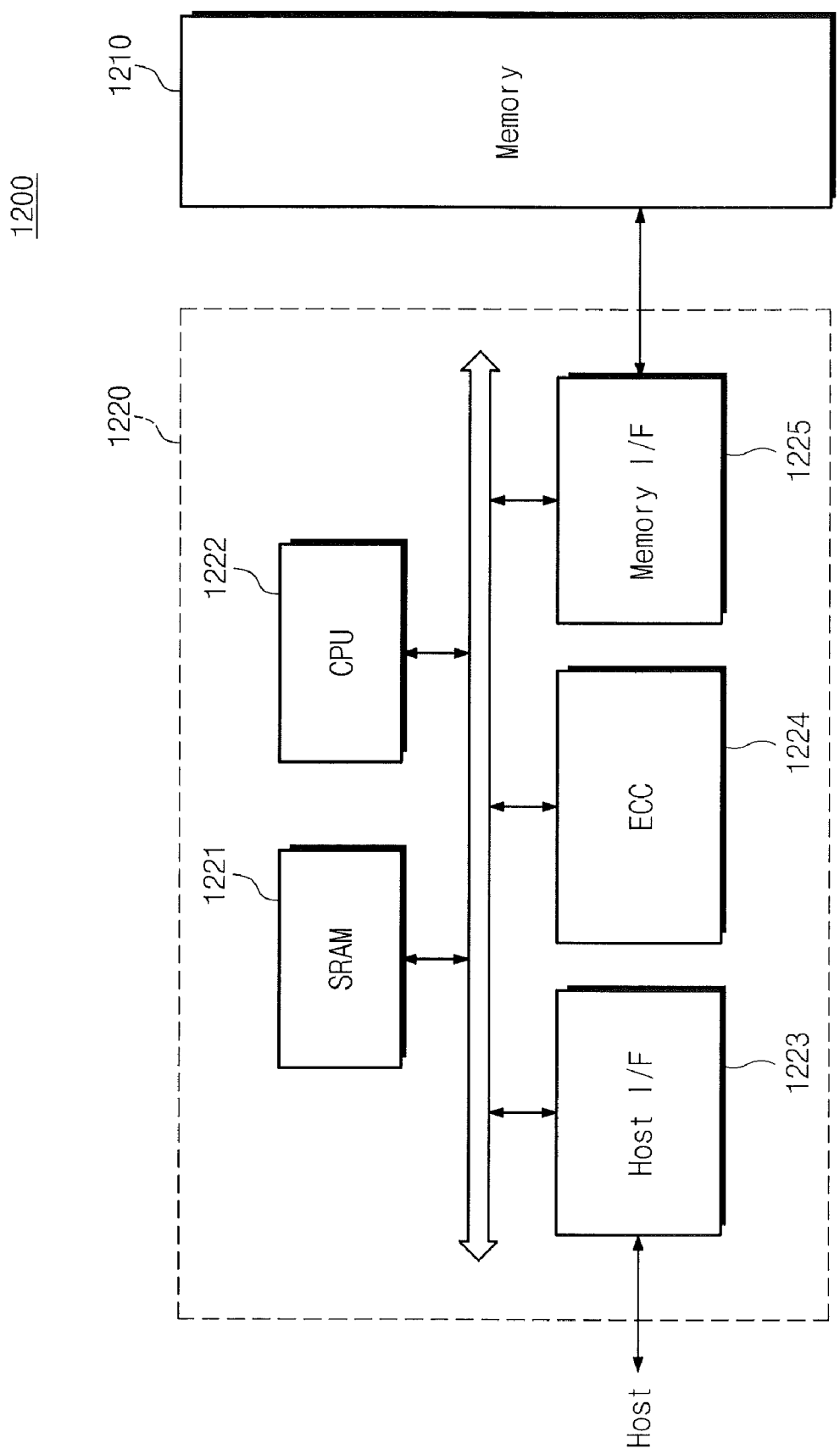
FIG. 9A is a block diagram illustrating a memory card including a metal interconnect according to an embodiment of the inventive concept.

FIG. 9A is a block diagram illustrating a memory card including a metal interconnect according to an embodiment of the inventive concept.

Referring to FIG. 9A, a semiconductor memory 1210 including the metal interconnect may be applied to a memory card 1200. For example, the memory card 1200 may include a memory controller 1220 controlling various data between a host and the memory 1210. A static random access memory (SRAM) 1221 may be used as an operation memory of a central processing unit (CPU) 1222. A host interface 1223 may include a data exchange protocol of the host connected to the memory card 1200. An error correcting code 1224 may detect and correct an error of data read from the memory 1210. A memory interface 1225 functions as an interface of the memory 1210. The central processing unit 1222 performs various control operations of the memory controller 1220 for exchanging data.

Figure 9B:
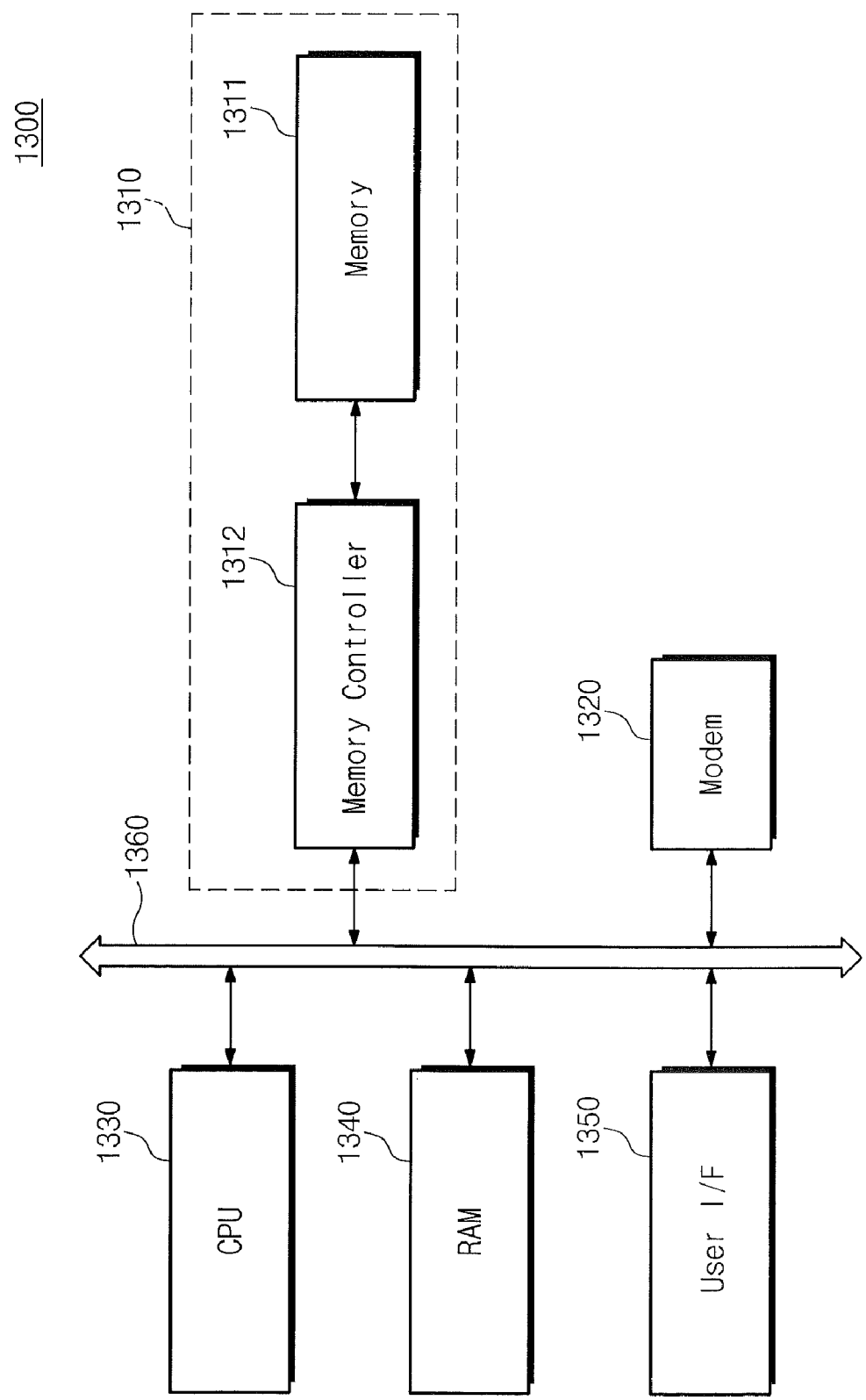
FIG. 9B is a block diagram illustrating an information processing system including a semiconductor device including a metal interconnect according to an embodiment of the inventive concept.

FIG. 9B is a block diagram illustrating an information processing system 1300 including a semiconductor device having a metal interconnect according to an embodiment of the inventive concept.

Referring to FIG. 9B, the information processing system 1300 may include a memory system 1310 including the semiconductor device having the metal interconnect. The information processing system 1300 may include a mobile device or a computer. For example, the information processing system 1300 may include a modem 1320, a central processing unit 1330, a RAM 1340, and a user interface 1350 that are electrically connected to a system bus 1360 to which the memory system 1310 is electrically connected. The memory system 1310 may include a memory 1311 and a memory controller 1312, and have substantially the same configuration as that of the memory card 1200 of FIG. 9A.

The memory system 1310 may store data processed by the central processing unit 1330, or data input from the outside. The information processing system 1300 may be provided as a memory card, a solid state disk (SSD), a camera image sensor, and an application chipset. For example, the memory system 1310 may be configured as an SSD. In this case, the information processing system 1300 stably and reliably stores a large amount of data in the memory system 1310.

According to the embodiment, the non-active segment is formed at the cathode of the metal line, and a void is deliberately formed in the non-active segment to decrease tensile stress, thus preventing a void from occurring under the via. Accordingly, line breakage due to electromigration is substantially prevented, thus improving electrical characteristics and service life of the device.

The metal interconnect and the method of fabricating the metal interconnect according to the embodiments can be applied to a semiconductor device and a semiconductor industry fabricating the semiconductor device. The metal interconnect and the method of fabricating the metal interconnect according to the embodiments can be widely applied to an industry fabricating an electronic appliance using a semiconductor device.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

The invention claimed is:

1. An integrated circuit device, comprising:
   an electrical interconnect structure on a substrate, said electrical interconnect structure comprising:
   a lower metallization pattern having a first end;
   an upper metallization pattern overlapping the lower metallization pattern; and
   an electrically conductive via extending vertically from a lower surface of the upper metallization pattern to a first contact region on an upper surface of the lower metallization pattern; and
   wherein the first end of the lower metallization pattern is spaced-apart from the first contact region by an electrically inactive portion of the lower metallization pattern that is shaped to have sidewalls that are tapered to a point at the first end so that the lower metallization pattern has a narrowing cross-section when viewed in a direction extending from the first contact region to the point at the first end.

2. The device of claim 1, wherein the tapered sidewalls of the electrically inactive portion of the lower metallization pattern have a stair-stepped shape.

3. The device of claim 1, wherein the point at the first end is a sharp arrow-shaped point.

4. The device of claim 1, wherein a length of the electrically inactive portion extending from the first contact region to the point is greater than a width of an electrically active portion of the lower metallization pattern.

5. The device of claim 1, wherein said electrical interconnect structure further comprises:
   the lower metallization pattern having a second end opposite to the first end;
   a second upper metallization pattern overlapping the lower metallization pattern; and
   a second electrically conductive via extending vertically from a lower surface of the second upper metallization pattern to a second contact region on the upper surface of the lower metallization pattern;
   wherein the second end of the lower metallization pattern is space-apart from the second contact region by a second electrically inactive portion of the lower metallization pattern that is shaped to have sidewall that is tapered to a second point at the second end so that the lower metallization pattern has a second narrowing cross-section when viewed in a second direction extending from the second contact region to the second point of the second end.

6. A metal interconnect of a semiconductor device, the metal interconnect comprising:
   a metal line having a first end and a second end comprising a rounded segment disposed on an opposite side to the first end;
   a via electrically connected to the metal line; and
   a non-active segment extending from the first end and including a void.

7. The metal interconnect of claim 6, wherein current is introduced to the metal line through the via, the current flows from the second end to the first end, and the current flows without the non-active segment.

8. The metal interconnect of claim 6, wherein the non-active segment has a sharp shape that decreases in width in a direction extending from the first end.

9. The metal interconnect of claim 6, wherein the non-active segment has a minimum length that is the same as a saturation length of the void.

10. The metal interconnect of claim 6, wherein the void is disposed in an end of the non-active segment.

11. The metal interconnect of claim 6, wherein the metal line comprises an active segment providing a path of the current between the first and second ends, and the non-active segment extends from the active segment at the first end.

12. The metal interconnect of claim 11, wherein the void has a saturation length that is proportional to at least one of a length of the active segment and a density of the current flowing through the active segment.

13. A metal interconnect of a semiconductor device, the metal interconnect comprising:

a metal line having a first end and a second end disposed on an opposite side to the first end;

a via electrically connected to the metal line;

a first non-active segment extending from the first end and including a first void; and a second non-active segment extending from the second end and including a second void, the second non-active segment having a sharp or cascade shape that decreases in width in a second direction extending from the second end.

14. The metal interconnect of claim 13, wherein the first non-active segment has a sharp shape that decreases in width from the first end to an end of the first non-active segment.

15. The metal interconnect of claim 13, wherein the first non-active segment has a length that is equal to or greater than a saturation length of the first void.

16. The metal interconnect of claim 13, wherein an electron is introduced to the first end through the via, and the electron flows from the first end to the second end.

17. The metal interconnect of claim 16, wherein a tensile stress evolves in a region of the first end under the via, and the tensile stress is decreased toward the first non-active segment and released by the first void.

18. The metal interconnect of claim 16, wherein a compressive stress evolves in the second end, and generates a back pressure offsetting a flow of the electron.

* * * * *